United States Patent
Persson et al.

(10) Patent No.: US 11,580,402 B2
(45) Date of Patent: Feb. 14, 2023

(54) SYSTEM AND METHOD FOR COMPRESSING ACTIVATION DATA

(71) Applicant: Arm Limited, Cambridge (GB)

(72) Inventors: Erik Persson, Lund (SE); Sven Ola Johannes Hugosson, Lund (SE)

(73) Assignee: ARM Limited, Cambridge (GB)

( * ) Notice: Subject to any disclaimer, the term of this patent is extended or adjusted under 35 U.S.C. 154(b) by 362 days.

(21) Appl. No.: 16/871,785

(22) Filed: May 11, 2020

(65) Prior Publication Data
US 2021/0350240 A1 Nov. 11, 2021

(51) Int. Cl.
| | | |
|---|---|---|
| G06N 3/08 | (2006.01) | |
| G06N 3/082 | (2023.01) | |
| G06N 3/084 | (2023.01) | |
| H03M 7/30 | (2006.01) | |
| H03M 7/40 | (2006.01) | |
| G06N 20/00 | (2019.01) | |

(52) U.S. Cl.
CPC .......... *G06N 3/082* (2013.01); *G06N 3/084* (2013.01); *G06N 20/00* (2019.01); *H03M 7/4075* (2013.01); *H03M 7/6011* (2013.01)

(58) Field of Classification Search
CPC ........ G06N 3/082; G06N 20/00; G06N 3/084; H03M 7/4075; H03M 7/6011
See application file for complete search history.

(56) References Cited

U.S. PATENT DOCUMENTS

| | | | | |
|---|---|---|---|---|
| 2019/0306526 | A1* | 10/2019 | Cho | G06N 20/00 |
| 2019/0370667 | A1* | 12/2019 | Georgiadis | G06N 3/04 |
| 2019/0373264 | A1* | 12/2019 | Chong | H04N 19/13 |
| 2020/0336155 | A1* | 10/2020 | Ovsiannikov | G06F 9/30145 |
| 2021/0243442 | A1* | 8/2021 | Said | H04N 19/126 |

OTHER PUBLICATIONS

Weinberger et al, (The LOCO-I Lossless Image Compression Algorithm: Principles and Standardization into JPEG-LS, IEEE Transactions on Image Processing, vol. 9, No. 8, Aug. 2000, pp. 1309-1324) (Year: 2000).*
Kirkpatrick et al., "Optimization by Simulated Annealing", Science, New Series, vol. 220, No. 4598, May 13, 1983, pp. 671-680.
De Boer et al., "A Tutorial on the Cross-Entropy Method", Electrical Engineering, Mathematics and Computer Science department, University of Twente, Sep. 2, 2003, pp. 1-47.
(Continued)

*Primary Examiner* — Oleg Korsak
(74) *Attorney, Agent, or Firm* — EIP US LLP

(57) ABSTRACT

A method for adapting a trained neural network is provided. Input data is input to the trained neural network and a plurality of filters are applied to generate a plurality of channels of activation data. Differences between corresponding activation values in the plurality of channels of activation data are calculated and an order of the plurality of channels is determined based on the calculated differences. The neural network is adapted so that it will output channels of activation data in the determined order. The ordering of the channels of activation data is subsequently used to compress activation data values by taking advantage of a correlation between activation data values in adjacent channels.

16 Claims, 12 Drawing Sheets

(56) References Cited

OTHER PUBLICATIONS

Wikipedia, "FELICS", Feb. 21, 2020, https://en.wikipedia.org/w/index.php?title=FELICS&oldid=941891110.
Howard et al., "Fast and Efficient Lossless Image Compression", IEEE Computer Society/NASA/CESDIS Data Compression Conference, Snowbird, Utah, Mar. 30-Apr. 1, 1993, pp. 351-360.
Zhan et al., "List-Based Simulated Annealing Algorithm for Traveling Salesman Problem", Computational Intelligence and Neuroscience, Mar. 13, 2016.
Wikipedia, "Simulated annealing", https://en.wikipedia.org/w/index.php?title=Simulated_annealing&oldid=948050151.
Wu et al., Stochastic Runtime Analysis of a Cross-Entropy Algorithm for Traveling Salesman Problems, Theoretical Computer Science, Oct. 12, 2017, pp. 1-40.
Wikipedia, "Cross-entropy method", https://en.wikipedia.org/w/index.php?title=Crossentropy_method&oldid=932375194.
He et al. "Channel Pruning for Accelerating Very Deep Neural Networks", Megvii Inc., Aug. 21, 2017, pp. 1-10.
De Boer et al., "A Tutorial on the Cross-Entropy Method", Electrical Engineering, Mathematics and Computer Science department, University of Twente, pp. 1-47.

* cited by examiner

| |  | Transmit raw |
| |  | Predict from left |
| |  | Predict from top |
| |  | Merge (3*left + 3*top + 2*topleft)/8 | elem pred delta

|   | 2 | 2 | 2 | 2 | 2 | 2 | 2 |
|---|---|---|---|---|---|---|---|
| 1 | 3 | 4 | 5 | 6 | 7 | 8 | 9 |
| 1 | 4 | 5 | 6 | 7 | 8 | 9 | 10 |
| 1 | 5 | 6 | 7 | 8 | 9 | 10 | 11 |
| 1 | 6 | 7 | 8 | 9 | 10 | 11 | 12 |
| 1 | 7 | 8 | 9 | 10 | 11 | 12 | 13 |
| 1 | 8 | 9 | 10 | 11 | 12 | 13 | 14 |
| 1 | 9 | 10 | 11 | 12 | 13 | 14 | 15 |

SYSTEM AND METHOD FOR COMPRESSING ACTIVATION DATA

BACKGROUND OF THE INVENTION

Field of the Invention

The present invention relates to a method of adapting a trained neural network, a method of compressing activation data, a method of decompressing activation data and associated data processing systems.

Description of the Related Technology

In a convolutional neural network, an image is received at an input layer and filters are applied to the input image to generate one or more feature maps in one or more intermediate layers, sometimes also referred to as hidden layers. The filters include weight values which are convolved with the values of the input image to generate the feature maps. In subsequent intermediate layers, the filters act on feature maps from a preceding layer. The convolved values are then transformed into activation data values by an activation function. The activation values form activation data and if there are a plurality of feature maps generated by filters in an intermediate layer, these feature maps form channels of activation data. The feature maps are successively processed in intermediate layers until a fully connected layer generates an output.

Specialized processors adapted for performing calculations for neural networks are known as neural processing units (NPU). When an NPU performs processing relating to a neural network the amount of activation data at each intermediate layer may be much larger than the available local memory on the NPU. To handle this, activation values may be written to and read from a memory. Writing to and reading from the memory across a bus from the NPU can be slow. Therefore, the activation values are compressed to allow these read and write actions to be performed faster and more efficiently.

Another feature of neural networks is the desire to make the networks quicker to process by reducing the number of calculations required by the neural network. One way of doing this is channel pruning. In the paper "Channel Pruning for Accelerating Very Deep Neural Networks" (He, Y., Zhang, X., and Sun, J., 2017), the authors describe deletion of redundant channels on feature maps.

In view of the above, methods for improving the compression of activation data in neural networks are desirable.

SUMMARY

According to a first aspect there is provided a method performed by a processing element for adapting a trained neural network, the method comprising: inputting input data to the trained neural network and applying a plurality of filters of the neural network to the input data to generate a plurality of channels of activation data; calculating differences between corresponding activation values in the plurality of channels of activation data; calculating cumulative differences between pairs of channels based on the calculated differences, so that the channels of the network form the nodes of a fully connected graph in which nodes of the graph correspond to channels of activation data and graph edges correspond to the cumulative differences between pairs of channels; determining an order of the plurality of channels based on the calculated cumulative differences; and adapting the neural network so that it will generate channels of activation data in the order determined in the determining step to generate an adapted neural network.

According to a second aspect there is provided a data processing system comprising a processing element and a storage, the storage storing code portions that, when executed by the processing element, cause the data processing system to perform a method for adapting a trained neural network, the method comprising: inputting input data to the neural network; applying a set of filters of the neural network to the input data to generate a plurality of channels of activation data; calculating differences between corresponding activation values in the plurality of channels of activation data; calculating cumulative differences between pairs of channels based on the calculated differences, so that the channels of the network form the nodes of a fully connected graph in which nodes of the graph correspond to channels of activation data and graph edges correspond to the cumulative differences between pairs of channels; determining an order of the plurality of channels based on the calculated cumulative differences; and adapting the neural network so that it will generate channels of activation data in the order determined in the determining step to generate an adapted neural network.

According to a third aspect there is provided a data processing system comprising a processing element and a storage, the storage storing code portions that, when executed by the processing element, cause the data processing system to perform a method for adapting a trained neural network, the method comprising: inputting input data to the neural network; applying a set of filters of the neural network to the input data to generate an ordered sequence of channels of activation data, wherein the channels of activation data are generated from the neural network in an order that has been selected to reduce a difference between corresponding activation data values in adjacent channels of activation data; compressing a value associated with a channel of activation data, wherein the compressing comprises calculating a difference between the value associated with the channel of activation data and a prediction for the value based on a corresponding value in a neighboring channel in the ordered sequence of channels and compressing a difference between the value and the prediction for the value.

BRIEF DESCRIPTION OF THE DRAWINGS

FIG. 11 shows a processing order for recovering delta-encoded activation data; and FIG. 12 shows neighboring values around a value to be predicted in a delta-encoding method.

DETAILED DESCRIPTION OF CERTAIN INVENTIVE EMBODIMENTS

Figure 1:
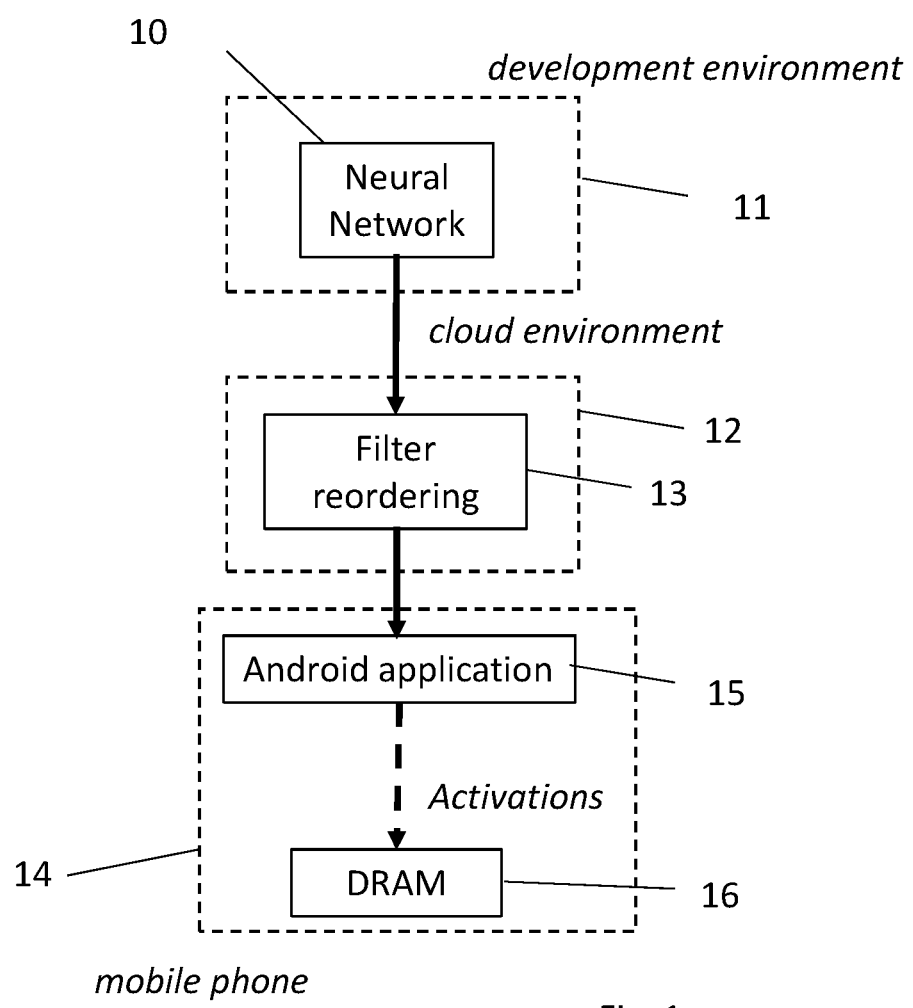
FIG. 1 shows an overview of a deployment and use of a neural network.

Before discussing the embodiments with reference to the accompanying figures, the following description of embodiments is provided.

In a first embodiment there is provided a method performed by a processing element for adapting a trained neural network, the method comprising: inputting input data to the trained neural network and applying a plurality of filters of the neural network to the input data to generate a plurality of channels of activation data; calculating differences between corresponding activation values in the plurality of channels of activation data; determining an order of the plurality of channels based on the calculated differences; and adapting the neural network so that it will generate channels of activation data in the order determined in the determining step.

In some embodiments the input data is one of real image data or a parametrized data having a representative set of frequency characteristics. The parameterized data may include pink or brown noise.

Determining an order of the channels may comprise determining an order of the channels to reduce a cumulative difference between corresponding activation values in adjacent channels. The order of the channels may minimize the cumulative difference between corresponding activation values in adjacent channels.

In some implementations, the channels of the network may form the nodes of a fully connected graph. The cumulative differences between corresponding activation values in adjacent channels may form weights of edges of a fully connected graph. The step of determining an order of the channels may include minimizing or reducing the cumulative difference between the corresponding activation values in adjacent channels by solving the travelling salesman problem across the fully connected graph. Solving the travelling salesman problem may comprise use of a cross-entropy method or simulated thermal annealing. The solution of the travelling salesman problem may provide the determined order of the channels. The determined order of the channels may be used to rearrange the filters within the neural network.

In a second embodiment there is provided a data processing system comprising a processing element and a storage, the storage storing code portions that, when executed by the processing element, cause the data processing system to perform a method for adapting a trained neural network, the method comprising: inputting input data to the trained neural network and applying a plurality of filters of the neural network to the input data to generate a plurality of channels of activation data; calculating differences between corresponding activation values in the plurality of channels of activation data; determining an order of the plurality of channels based on the calculated differences; and adapting the neural network so that it will output channels of activation data in the order determined in the determining step.

In a third embodiment there is provided a non-transitory computer-readable storage medium storing code portions that, when executed by a data processing system, cause the data processing system to perform a method for adapting a trained neural network, the method comprising: inputting input data to the trained neural network and applying a plurality of filters of the neural network to the input data to generate a plurality of channels of activation data; calculating differences between corresponding activation values in the plurality of channels of activation data; determining an order of the plurality of channels based on the calculated differences; and adapting the neural network so that it will output channels of activation data in the order determined in the determining step.

In a fourth embodiment there is provided a method, performed by a processing element, of compressing activation data from a neural network, the method comprising: inputting input data to the neural network; applying a set of filters of the neural network to the input data to generate an ordered sequence of channels of activation data, wherein the channels of activation data are generated from the neural network in an order that has been selected to reduce a difference between corresponding activation data values in adjacent channels of activation data; compressing a value associated with a channel of activation data, wherein the compressing comprises calculating a difference between the value associated with the channel of activation data and a prediction for the value based on a corresponding value in a neighboring channel in the ordered sequence of channels and compressing a difference between the value and the prediction for the value.

The value may be a parameter for creating a variable length code and the prediction for the value may be a corresponding value of the parameter for creating a variable length code in the neighboring channel. The parameter for creating a variable length code may be a Golomb-Rice code parameter.

The value associated with the channel of activation data may be an activation data value within the channel of activation data. The prediction of the activation data value may be based on a corresponding activation data value in the neighboring channel. In some implementations, the prediction of the activation data value may not be based on other activation data values in the same channel of activation data.

In other implementations, the prediction value may be based on a corresponding activation data value in the neighboring channel and a value of one or more other activation values in the same channel of activation data.

The activation data in each channel may be grouped into arrays of activation data such that each activation data value has a position within the array of activation data.

The prediction of the activation data value may be based on a linear combination of activation data values within the same channel having locations one position to the left of the activation data value, one position above the activation data value, one position diagonally to the upper-left of the activation data value, and an activation data value in an adjacent channel having the same position.

The prediction of the activation data value may be a linear combination of activation data values having locations one position above the activation data value in the same channel, and the same position in an adjacent channel.

The prediction of the activation data value may be a linear combination of activation data values having locations one position to the left of the activation data value, and an activation data value having the same position in an adjacent channel.

The prediction of the activation data value may be selected from two or more neighboring activation data values. One neighboring activation data value may be an activation data value having the same position in an adjacent channel and the other neighboring activation data values may be in the same channel of activation data. If the activation data value to be predicted has a value falling in a range between the highest and the lowest values of the two or more neighboring activation data values, then the difference is calculated between the activation data value to be predicted and the lowest valued neighboring activation data values. If the activation data value to be predicted is larger than the highest value of the two or more neighboring activation data values, then the difference is calculated between the activation data value to be predicted and the highest valued neighboring activation data value. If the activation data value to be predicted is smaller than the lowest value of the two or more neighboring activation data values, then the difference is calculated between the activation data value to be predicted and the lowest valued neighboring activation data value.

In each of the above implementations the difference between the activation data value and the prediction of the value may be compressed using a variable length code. The variable length code may be a Golomb-Rice code.

The method may further comprise a step of the processing element writing the compressed value to a storage.

In a fifth embodiment there is provided a data processing system comprising a processing element and a storage, the storage storing code portions that, when executed by the processing element, cause the data processing system to perform a method of compressing activation data from a neural network, the method comprising: inputting input data to the neural network; applying a set of filters of the neural network to the input data to generate an ordered sequence of channels of activation data, wherein the channels of activation data are generated from the neural network in an order that has been selected to reduce a difference between corresponding activation data values in adjacent channels of activation data; compressing a value associated with a channel of activation data, wherein the compressing comprises calculating a difference between the value associated with the channel of activation data and a prediction for the value based on a corresponding value in a neighboring channel in the ordered sequence of channels and compressing a difference between the value and the prediction for the value.

In a sixth embodiment there is provided a non-transitory computer-readable storage medium storing code portions that, when executed by a data processing system, cause the data processing system to perform a method of compressing activation data from a neural network, the method comprising: inputting input data to the neural network; applying a set of filters of the neural network to the input data to generate an ordered sequence of channels of activation data, wherein the channels of activation data are generated from the neural network in an order that has been selected to reduce a difference between corresponding activation data values in adjacent channels of activation data; compressing a value associated with a channel of activation data, wherein the compressing comprises calculating a difference between the value associated with the channel of activation data and a prediction for the value based on a corresponding value in a neighboring channel in the ordered sequence of channels and compressing a difference between the value and the prediction for the value.

In a seventh embodiment there is provided a method of decompressing compressed activation data, the method comprising: reading compressed activation data from a storage, wherein the compressed activation data includes an ordered sequence of channels of activation data generated by a plurality of filters of a neural network; determining a predicted value for a compressed value associated with a channel of activation data; and determining a decompressed value by adding the predicted value and the compressed value; wherein the predicted value is determined based on a corresponding decompressed value in a neighboring channel.

In an eighth embodiment there is provided a data processing system comprising a processing element and a storage, the storage storing code portions that, when executed by the processing element, cause the data processing system to perform a method of decompressing compressed activation data, the method comprising: reading compressed activation data from a storage, wherein the compressed activation data includes an ordered sequence of channels of activation data generated by a plurality of filters of a neural network; determining a predicted value for a compressed value associated with a channel of activation data; and determining a decompressed value by adding the predicted value and the compressed value; wherein the predicted value is determined based on a corresponding decompressed value in a neighboring channel.

In an ninth embodiment there is provided a non-transitory computer-readable storage medium storing code portions that, when executed by a data processing system, causes the data processing system to perform a method of decompressing compressed activation data, the method comprising: reading compressed activation data from a storage, wherein the compressed activation data includes an ordered sequence of channels of activation data generated by a plurality of filters of a neural network; determining a predicted value for a compressed value associated with a channel of activation data; and determining a decompressed value by adding the predicted value and the compressed value; wherein the predicted value is determined based on a corresponding decompressed value in a neighboring channel.

In a tenth embodiment there is provided a method, performed by a processing element, of compressing weight values of a neural network, the method comprising: inputting input data to the neural network; applying an ordered set of filters of the neural network to the input data to generate an ordered sequence of channels of activation data, wherein the channels of activation data are generated from the neural network in an order that has been selected to reduce a difference between corresponding activation data values in adjacent channels of activation data; compressing a weight value associated with a filter of the set of filters, wherein the compressing comprises calculating a difference between the weight value associated with the filter and a prediction for the weight value based on a corresponding weight value in a neighboring filter and compressing a difference between the weight value and the prediction for the weight value.

In an eleventh embodiment there is provided a data processing system comprising a processing element and a storage, the storage storing code portions that, when executed by the processing element, cause the data processing system to perform a method of compressing weight values of a neural network, the method comprising: inputting input data to the neural network; applying an ordered set of filters of the neural network to the input data to generate an ordered sequence of channels of activation data, wherein the channels of activation data are generated from the neural network in an order that has been selected to reduce a difference between corresponding activation data values in adjacent channels of activation data; compressing a weight value associated with a filter of the set of filters, wherein the compressing comprises calculating a difference between the weight value associated with the filter and a prediction for the weight value based on a corresponding weight value in a neighboring filter and compressing a difference between the weight value and the prediction for the weight value.

In a twelfth embodiment there is provided a non-transitory computer-readable storage medium storing code portions that, when executed by a data processing system, cause the data processing system to perform a method of compressing weight values of a neural network, the method comprising: inputting input data to the neural network; applying an ordered set of filters of the neural network to the input data to generate an ordered sequence of channels of activation data, wherein the channels of activation data are generated from the neural network in an order that has been selected to reduce a difference between corresponding activation data values in adjacent channels of activation data; compressing a weight value associated with a filter of the set of filters, wherein the compressing comprises calculating a difference between the weight value associated with the filter and a prediction for the weight value based on a corresponding weight value in a neighboring filter and compressing a difference between the weight value and the prediction for the weight value.

Particular embodiments will now be described with reference to the Figures.

FIG. 1 is an overview of deployment and use of a convolutional neural network 10. The process starts with development of the neural network 10 and ends with execution of the neural network 10 on the mobile phone 14. Initially the neural network 10 is developed by a developer in a development environment 11. The development includes selection of parameters of the neural network 10, such as a number of filters for the neural network 10. The neural network 10 could be for performing any function, but in the first embodiment the neural network is for identifying faces in an input image.

Once the neural network 10 has been developed, the neural network 10 is uploaded to a cloud environment 12 where it is optimized as will be described below in connection with FIG. 2. The optimizing includes a filter re-ordering 13 process. The optimized neural network is then compiled into an Android® application 15 and deployed to the mobile phone 14. The mobile phone 14 is running the Android® operating system and receives the application 15 through an application store, such as Google® Play. When the application 15 is run on the mobile phone 14, the neural network 10 receives an input image to an input layer of the neural network 10 and generates a plurality of channels of activation data. As noted in the description of related technology, the activation data is larger in size than available memory of an NPU of the mobile phone 14 that processes the neural network 10. Accordingly, activation data is written to and read from a DRAM 16 in the mobile phone 14. In the description that follows, it will be explained how the re-ordering of channels 13 in the cloud environment 12 allows improved compression of the activation data in the mobile phone 14. Improving the compression of the activation data allows the activation data to be more quickly written to and read from the DRAM 16 and thereby improves the speed of processing of the neural network 10 at the mobile phone 14.

Figure 2:
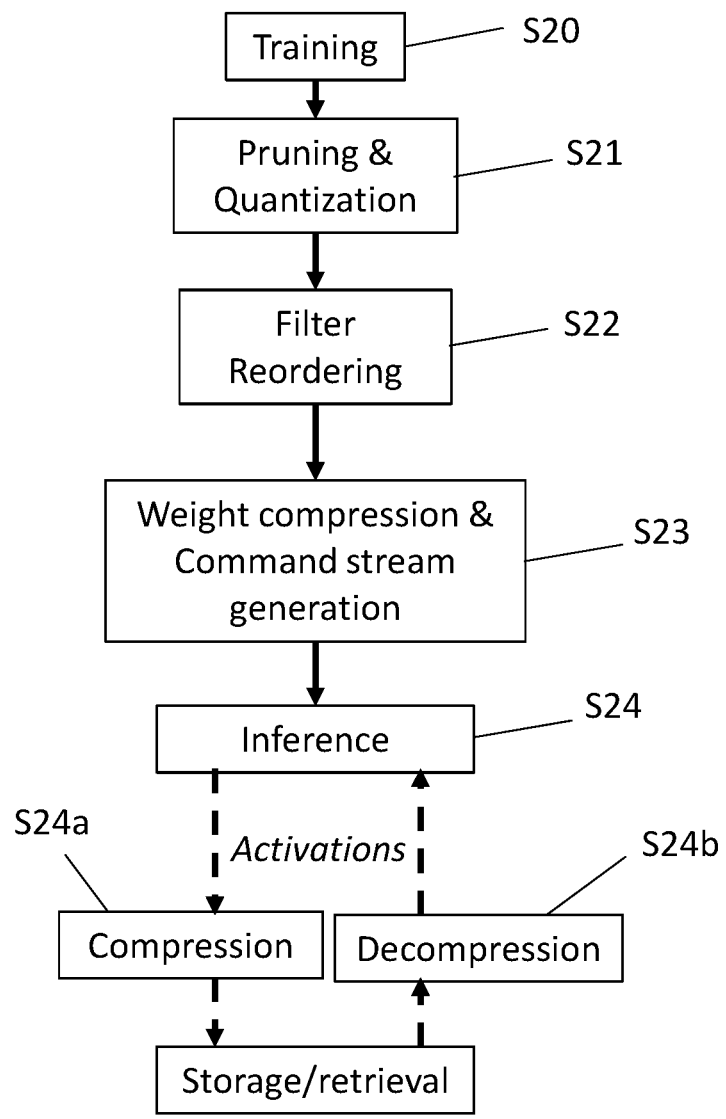
FIG. 2 shows steps for processing a convolutional neural network.

FIG. 2 shows steps for processing a convolutional neural network from a training step, S20, onwards. Steps S20 to S23 are performed in the cloud environment 12 and steps S24 to S27 are performed on the mobile phone 14. Steps S20 to S23 may be performed on a machine learning platform, for example by introducing new features into a product such as TensorFlow®. In step S20, a convolutional neural network 10 is trained using a training data set. In the first embodiment, the neural network 10 is trained with a dataset consisting of images including images including faces and images not including faces. During training, errors in recognition are propagated backwards through the neural network 10, which adjusts the weight values of the neural network 10. The adjusted weights are then used on the next training image. Training of convolutional neural networks is known in the art, so the process is not described in detail here. The result of training is that the weight values of the neural network 10 have been adjusted to detect faces based on the information in the training dataset.

Once the neural network 10 has been trained, a pruning and quantization step S21 is performed. The pruning aims to reduce the computational burden of performing inference using the neural network 10. In one method, the L1 norm of weight values that make up the filters is determined, and the lowest valued filters are removed from the neural network 10. Removing filters from the neural network affects the accuracy of the neural network 10. Consequently, the neural network 10 retrained after pruning and a determination is made regarding whether further pruning of filters is appropriate depending on the resulting accuracy of the re-trained convolutional network 10. Another or further pruning method is to consider individual weight values within the filters and to adjust weight values having a small absolute value to take a zero value. Pruning of convolutional neural networks is known in the art and any suitable method may be chosen. After pruning, the quantization process may further reduce the size of the neural network 10 by reducing the number of bits used to represent weight values within the neural network. For example, the neural network 10 may be trained using 32-bit weight values, but the weight values may be converted to 8-bit values during the quantization process. Again, quantization is known, and any suitable method of quantization may be used.

Following the pruning and quantization step S21, the filters are re-ordered in step S22. The order of filters in a convolutional neural network 10 is the order in which the filters are convolved with the image data in the input layer or, in subsequent layers, convolved with the activation data of a preceding layer. When the neural network 10 is trained during the training step S20, the filters are adapted based on the training data and the filters are not generated in any particular order. Accordingly, when the filters are applied to the input layer or a feature map, there may be little correlation between activation data values in adjacent channels of activation data created by the filters. On the other hand, it is often the case that filters of the convolutional neural network are not orthogonal and consequently there is correlation between activation data in channels of the activation data. Accordingly, in step S21, the filters are re-ordered within the neural network in order to increase correlation between adjacent channels of output activation data. The process of filter re-ordering will be described in more detail later in the description.

After the filters have been re-ordered in S22, a weight compilation and command stream generation step, S23, occurs. This step is part of a compilation process and is where the neural network is packaged into the application that is to be sent to the mobile phone 14.

The application is received at the mobile phone 14, as described in connection with FIG. 1, and the user launches the application and causes an image to be input into the neural network. In step, S24, the neural network performs inference using the neural network to detect faces in the input image. As explained in the introduction, this involves filters of the neural network 10 being convolved with the input image to generate one or more feature maps in one or more intermediate layers. The convolution of the filters with the input image data or activation data of a preceding intermediate layer generates activation data. The activation data is output in channels of activation data in the order in which the filters are applied in the neural network 10.

The activation data generated by processing the convolutional neural network 10 is greater than can be stored by the neural processing unit 33. Accordingly, in step S24a, activation data is compressed and stored in the DRAM 16. When the compressed activation data is needed again the compressed activation data is read from the DRAM 16 and decompressed in step S24b. When the inference step S24 is completed, the outcome of the face recognition is presented to a user of the mobile phone 14 by the application.

Figure 3:
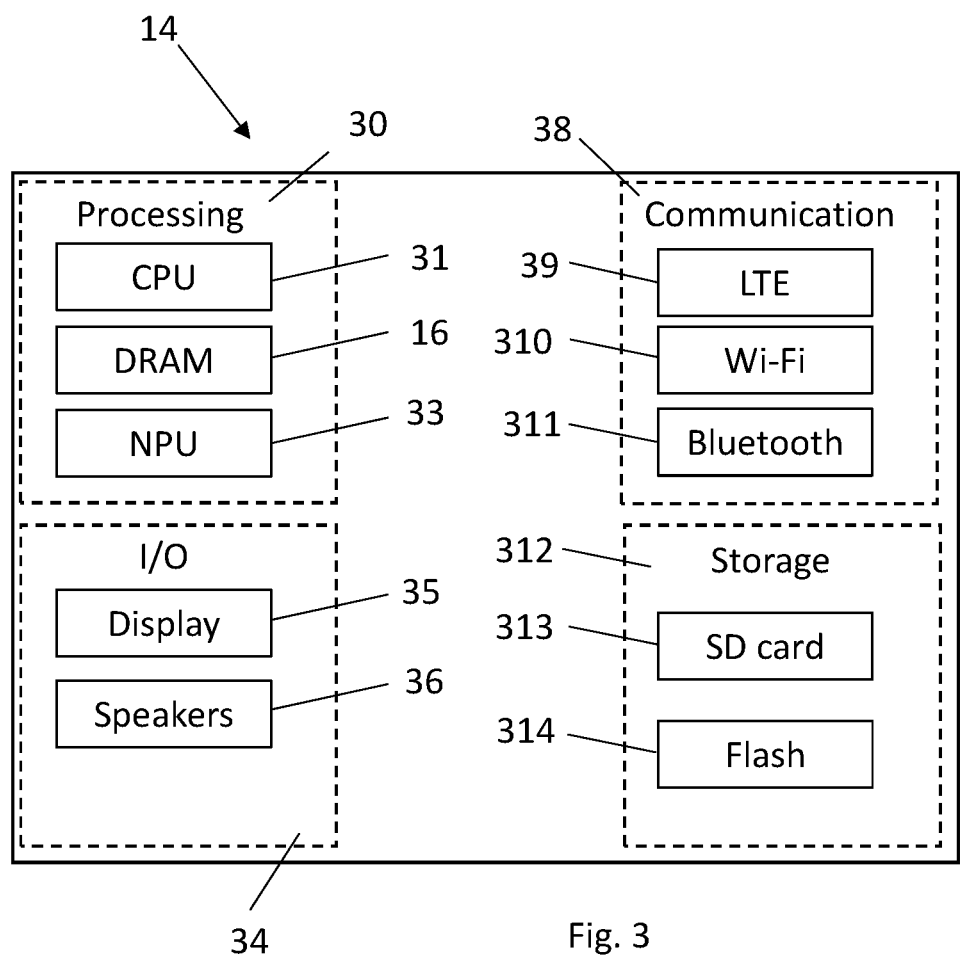
FIG. 3 is a block diagram illustrating hardware of a mobile telephone.

FIG. 3 shows hardware configuration of mobile telephone 14. It will be appreciated that the mobile phone may also include further components, which aren't shown or described. The mobile telephone 14 includes processing components 30. The processing components include a CPU 31, a DRAM 16, and a neural processing unit 33. The mobile phone 14 includes a set of I/O components 34 for providing a user interface for the user. The I/O components include a touch panel display 35 and speakers 36. To allow the mobile phone to communicate over networks, a set of communication components 28 is provided. The communication components include an LTE module 39 for communicating over a mobile telephone network, a Wi-Fi® module for communicating over Wi-Fi and a Bluetooth® module to allow Bluetooth communication. A storage module 312 provides mass storage for the mobile phone 14. The storage module 312 includes an SD card slot and solid-state flash memory drive 314.

Figure 4:
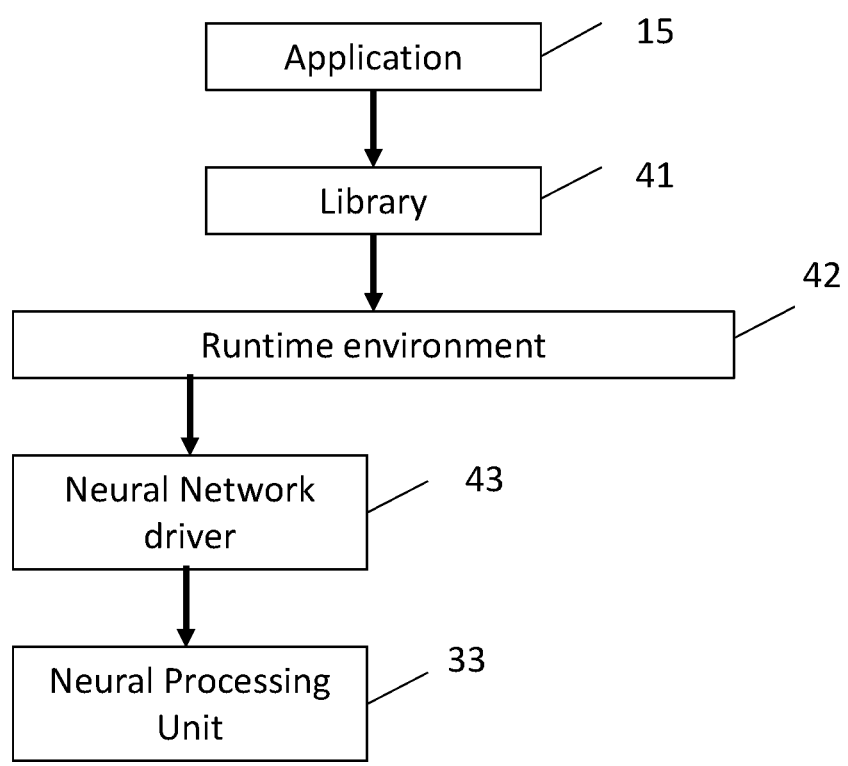
FIG. 4 is a block diagram illustrating software installed on the mobile telephone.

FIG. 4 shows the application 15 and part of the Android® operating system installed on the mobile phone 14. The application 15 includes a library 41 which it uses, when the application is being executed, to make requests to the Android® neural networks runtime environment 42. The neural networks runtime environment 42 manages hardware accelerated processing of calculations required by the convolutional neural network in the application 15. The runtime may allocate processing tasks to the dedicated neural processing unit 33, which enables to the hardware acceleration. A neural network driver 43 is provided to translate requests from the runtime environment 42 to the neural processing unit 33 and to perform other operations. In this way, the neural network 10 included in the application 15 can have appropriate calculations relating to the convolutional neural network hardware accelerated by processing on the neural processing unit 33.

Enhancement of the Neural Network Through Channel Re-Ordering

Figure 5:
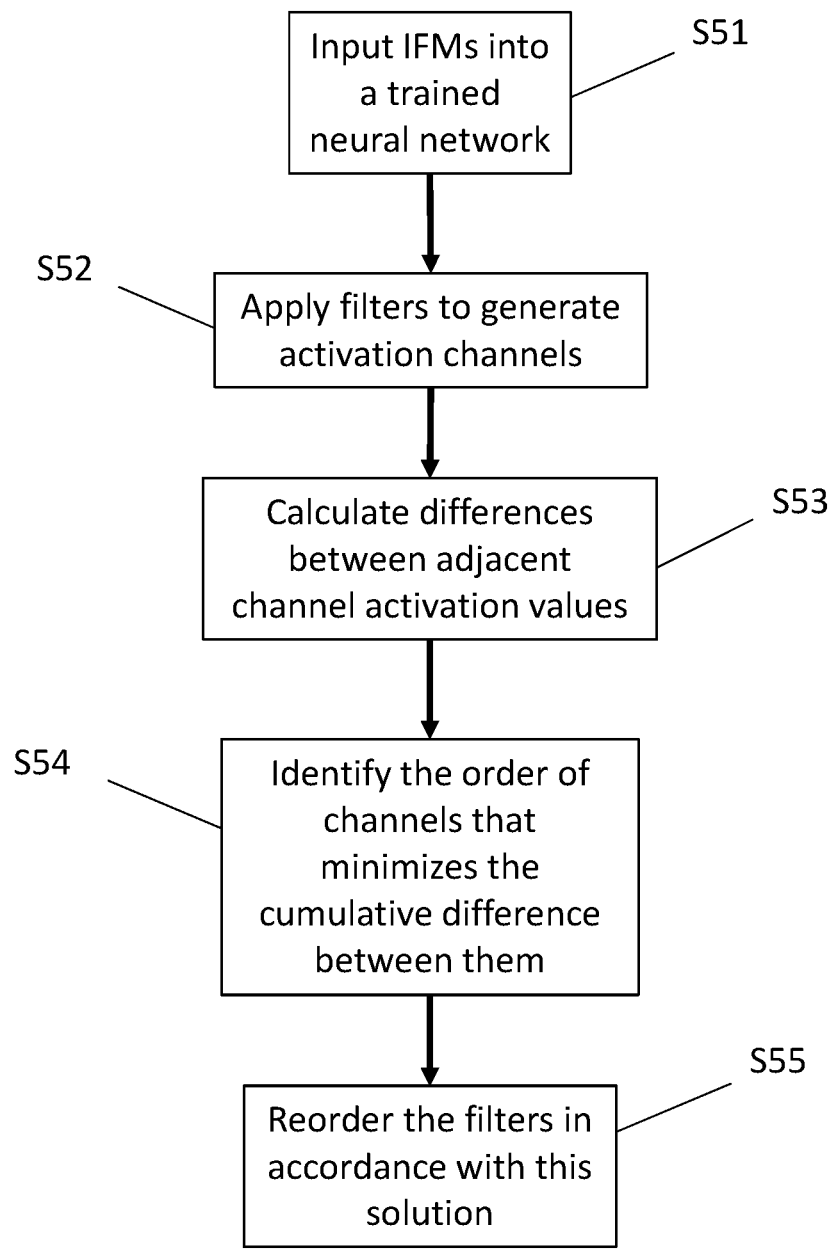
FIG. 5 is a flow diagram showing filter reordering within a neural network.

As mentioned above in connection with step S22, the filters of the trained neural network 10 are re-ordered, in order to increase the correlation between adjacent channels of output activation data. This process will now be described in greater detail. FIG. 5 is a flow diagram showing filter reordering within the neural network 10.

The process begins in step S51 with the trained neural network receiving an input image. There are no specific requirements as to the content of the input image; any relevant data set is suitable. In this embodiment, one or more of the training input images are re-used.

In step S52, this input image is processed by convolving the filters of the neural network with the input image along with use of an activation function to generate one or more feature maps in one or more intermediate layers. The convolution of the filters with the input image data or activation data of a preceding intermediate layer along with use of an activation function generates activation data, which is output in channels in the order in which the filters were applied in the neural network.

Once the channels of activation data of a layer of the neural network 10 have been generated, in step S53 a pairwise difference measurement between the channels of activation data is calculated. This difference measurement is obtained by taking the L1 norm of the difference between the channels of activation data.

The L1 norm of the difference between the channels is given by $$\text{Difference}(z_0, z_1) = \sum_{x,y} |A(x, y, z_0) - A(x, y, z_1)|$$

Where $z_0$ denotes the first channel, $z_1$ denotes the second channel, and x and y are the vertical and horizontal co-ordinates of a tensor of activation data within the channel. The value $A(x,y,z)$ is the activation data value having the location x,y in channel z. The sum of absolute difference values is performed over x and y so that a single difference value is calculated between each pair of channels.

Once a pairwise difference, Difference $(z_i, z_j)$, is calculated between each and every pair of channels of activation data, in step S54, the differences are used to find an order of channels that minimizes or reduces a cumulative difference between channels of activation data. The cumulative difference is the sum of the values Difference $(z_i, z_j)$ over the ordered set of channels.

The channels of activation data and Difference values may be visualized as a fully connected graph, in which the nodes of the graph correspond to channels of activation data of the network, and the Difference values correspond to the weights of the graph edges.

Figure 6:
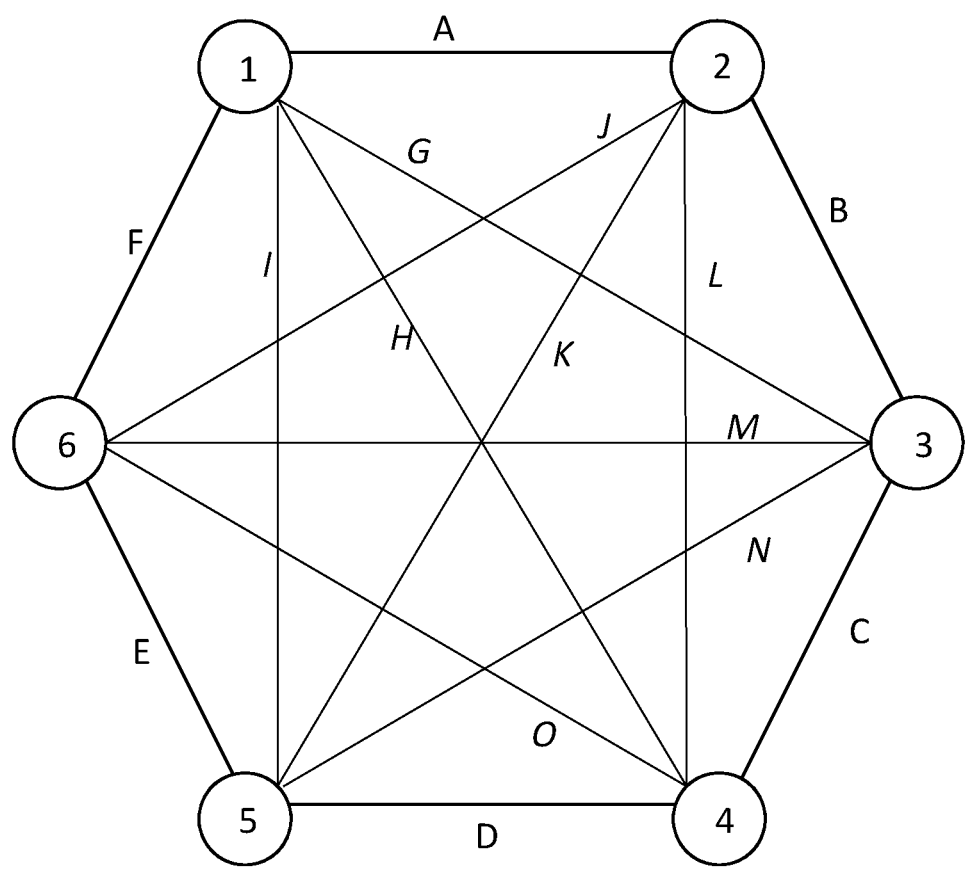
FIG. 6 shows a graph.

FIG. 6 shows such a graph. Nodes 1-6 represent channels of activation data of the neural network, while edge weights A-O represent the pairwise differences between the channels of activation data.

This graph then forms the object of a Travelling Salesman Problem (TSP). This problem is known in the art: for a given graph, a path must be found that travels through each node exactly once, while minimizing the total distance travelled. For example, in FIG. 6, ABCDEF could be one such a path as it passes through each node once. It should be noted that the travelling salesman problem may be referred to as how find a Hamiltonian path. In some formulations of the travelling salesman the salesman needs to return to the original node, but this is not necessary in this case. The identification of the Hamiltonian path and solution to the Travelling Salesman Problem are terms that may be used interchangeably.

The Travelling Salesman Problem cannot always be solved; however, methods for obtaining approximate solutions are known. This approximate solution may be obtained by using simulated thermal annealing (see S. Kirkpatrick, C. D. Gelatt Jr., M. P. Vecchi, *Optimization by Simulated Annealing*, 220 (4598) Sci. 671 (1983)) or the cross-entropy method (see Pieter-Tjerk De Boer, Dirk P. Kroese, Shie Mannor, Reuven Y. Rubinstein, *A Tutorial on the Cross-Entropy Method*, 134 Annals of Operations Res. 19 (2005)). Both methods for finding approximate solutions to the TSP are known in the art.

The solution of the TSP across the graph provides an optimal path. This optimal path is an order of the channels of activation data that will minimize the cumulative difference between activation data values in the channels of activation data. As discussed above, the TSP may not be exactly solved in which case the solution will find an order of channels that reduces the cumulative difference between the channels. This order of channels of activation data that reduces the pairwise difference, increases correlation between activation values in adjacent channels. As the order of the channels of activation data is the same as the order in which the filters of the neural network are applied, this order of channels of activation data also provides an enhanced order for applying the filters in the convolutional neural network.

In step S55, the filters of the network are re-ordered according to the order of channels calculated in step S54, to increase correlation between channels of activation data generated when the filters are applied. This is accomplished by re-arranging the weights within the trained neural network 10.

The reordering described above increases the correlation between channels of activation data for the specific input image processed by the network. It is expected that this determined order of filters will increase the correlation between output channels of activation data for a range of input images and not just the image used for the filter reordering process. In other embodiments, the re-ordering process could be performed for multiple input images generating a plurality of channel orders. The most common channel order may then be selected for re-ordering the filters of the convolutional neural network.

Compression of Activation Data Using an Optimized Neural Network

The filters of the neural network having been re-ordered to increase correlation between the output channels of activation data, the neural network may now exploit this correlation to improve compression of the activation data.

Figure 7:
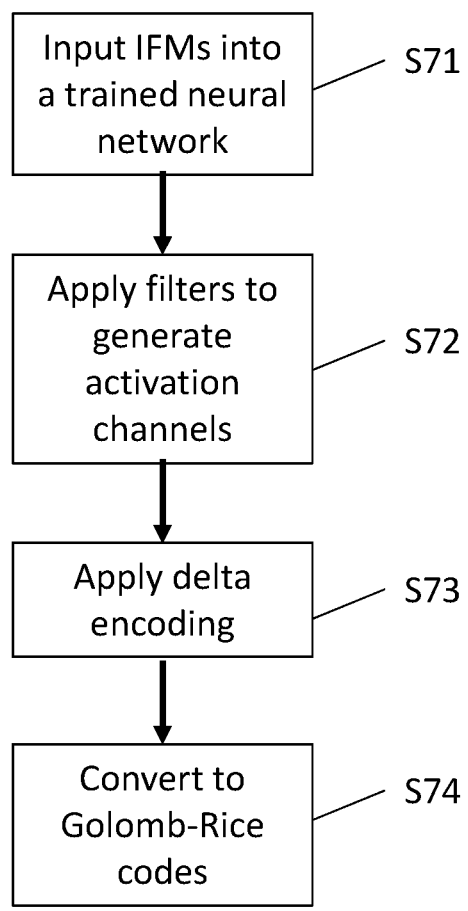
FIG. 7 is a flow chart showing steps of a method for compressing the activation data.

As described in connection with FIG. 2, the compression of activation data takes place on the mobile phone 14 during inference in step S24. FIG. 7 is a flow chart showing steps of a method for compressing the activation data. In step S71 the user provides the neural network 10 with an input image. In step S72, filters of the neural network 10 are convolved with the input image to generate one or more feature maps in one or more intermediate layers. The convolution of the filters with the input image data or activation data of a preceding intermediate layer in combination with an activation function generates activation data. The activation data is output in channels in the order in which the filters are applied in the neural network 10. As will be further described below, in step S73 delta encoding is performed by the NPU 33 to reduce the values to be encoded for storage in the DRAM 16 and in step S74, the delta-encoded values are converted to Golomb-Rice codes for storage in the DRAM 16.

The activation data is stored by the NPU 33 in the DRAM 16 because the quantity of data is too large for memory elements local to the NPU. Reading and writing activation data to a DRAM is a relatively slow process, as the data must pass across a bus between the NPU and the DRAM. To increase the speed and efficiency of the process, the activation data is compressed.

In step S74, the activation data is compressed by converting the activation data values to Golomb-Rice codes. Golomb-Rice codes are variable length codes, created by dividing the activation data value by a Golomb-Rice parameter M, to obtain a quotient q and a remainder r. These values then form a Golomb-Rice code consisting of the quotient q in unary code, followed by a zero bit, then the remainder encoded in a truncated binary.

Golomb-Rice codes have a smaller size if smaller values are encoded because the quotient portion is shorter. In order to minimize the size of the activation data to be stored in the DRAM, delta encoding is used to reduce the values of the activation data. Accordingly, in step S73, delta encoding comprises taking the difference (or delta) between a predicted activation data value and the activation value, then encoding this difference as a Golomb-Rice code. This reduces the size of the value to be encoded, which reduces the overall size of the variable length code.

Smaller delta values are obtained when the predicted activation data values are closer to the activation values. It is therefore desirable to have the predicted values of the activation data be as accurate as possible. The closer the predicted value is to the actual value, the smaller the delta value—and consequently the Golomb-Rice code—will be. To increase the accuracy of this prediction, the compression may take advantage of the increased correlation between adjacent channels of activation data caused by the previously described channel reordering.

The activation data within each channel is grouped into arrays, referred to as tiles of data. A tile of data is defined as an 8×8 group of activation data values, where an activation data value is an 8-bit uncompressed activation data value.

In the first specific embodiment, two methods for delta-encoding an activation value are used. One of the two methods is selected for each tile of activation data and the chosen method is indicated in a 1-bit prediction mode value in a header portion of the tile of compressed activation data that is stored in the DRAM 16.

In order to select a method for delta-encoding the activation data, the neural processing unit 33 compresses the activation data using each delta-encoding method and then selects the better compression (smaller compressed size of activation data) for use in that tile. Other ways of selecting the delta-encoding method are possible, such as by using heuristics to select between the methods.

The first method of delta-encoding the activation data is identified in the tile header by setting the prediction mode bit equal to 0. In this method, the value of a given activation data value in an 8×8 tile is predicted based on other activation data values within the same tile and the same channel of activation data. This method will now be described with reference to FIG. 8 which illustrates logic of a prediction scheme used for delta-encoding activation data.

An 8×8 tile of activation data has values elem [i] [j] where i is the vertical coordinate and j is the horizontal coordinate. The top left most activation data value in a tile is elem [0][0]. This activation data value is not predicted but is instead stored without delta encoding. The prediction for each entry in the tile is pred [i] [j] where i is the vertical coordinate and j is the horizontal coordinate. A difference value, delta [i] [j], is the difference between elem RIM and pred [i] [j].

delta[$i$][$j$]=elem[$i$][$j$]−pred[$i$][$j$]

Figure 8:
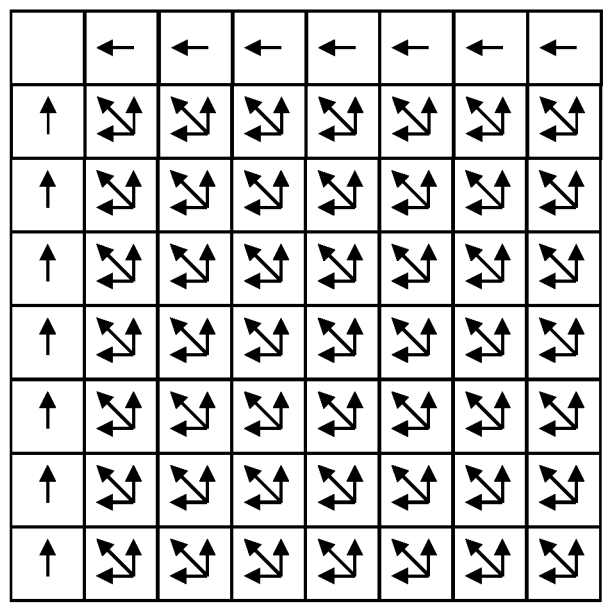
FIG. 8 illustrates logic of a prediction scheme used for delta-encoding activation data.
Figure 8:
Figure 8:
Figure 8:
Figure 8:

In order to calculate pred NM, the following scheme is used. As shown in FIG. 8, activation data values on the left side of the tile are predicted using the activation data value located one position above. This applies to all left edge activation data values except the top-left activation data value.

pred[$i$][$j$]=elem[$i-1$][$j$]

Where $j=0$ and $i \neq 0$

Values of pred [i] [j] on the top row are predicted using the activation data value located one position to the left. This applies to all top activation data values except the top-left activation data value.

pred[i][j]=elem[i][j−1]

Where j≠0 and i=0

For the remaining values of pred [i] [j], except the top-left activation data value, the prediction is made using a weighted combination of the activation data value located one position to the left, the activation data value located on position diagonally to the upper-left, and the activation data value located above the predicted value.

pred[i][j]=3*elem[i][j−1]+2*elem[i−1][j−1]+3*elem[i−1][j]>>3

The above formula indicates that the left-side and upper activation data values are multiplied by three and the upper-left activation data value is multiplied by two in the linear combination. The last feature (>>3) indicates that the calculation is done in binary and represents a bit shift of 3 places. This has the effect of dividing by 8, while maintaining an integer value for pred [i][j].

Figure 9:
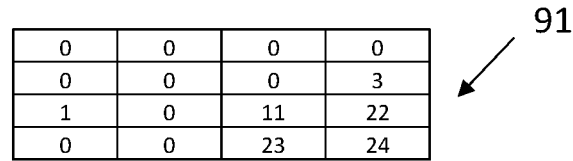
FIG. 9 illustrates a worked example of delta encoding activation data.
Figure 9:
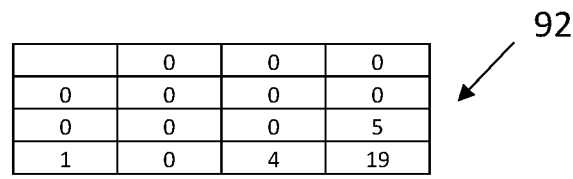
Figure 9:
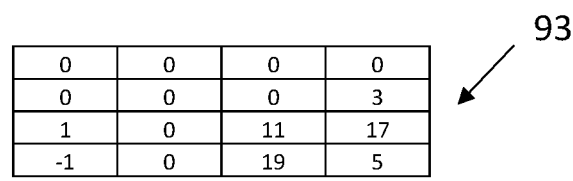

A worked example is now provided, with reference to FIG. 9. As noted above, the delta encoding is performed on 8×8 tiles of activation data. However, to keep the description concise an explanation of delta encoding on a 4×4 grid of data will be given. The top grid of data 91 shown in FIG. 9 is the original data for delta encoding. This data forms elem [i] [j] as described above.

In the middle grid of data 92, the predicted values, pred [i] [j], are shown. As the top row of the elem [i] [j] data is all zero values, the pred [i] [j] values on the top row are also all zero values. Looking at the left column, there is a single non-zero value in the elem data. Pred [3] [0] is equal to elem [2] [0], which has a value of 1.

Looking at the values away from the left and top edges, calculation of the three non-zero values in pred [i] [j] will be explained. Pred [3] [2] has a value of 4 and is calculated as follows:

$$pred[3][2] = 3*0 + 2*0 + 3*11 >> 3$$
$$= 33 >> 3$$
$$= 100001 >> 3$$
$$= 100$$
$$= 4$$

Pred [2] [3] has a value of 5 and is calculated as follows:

$$pred[2][3] = 3*11 + 2*0 + 3*3 >> 3$$
$$= 40 >> 3$$
$$= 101000 >> 3$$
$$= 101$$
$$= 5$$

Pred [3] [3] has a value of 19 and is calculated as follows:

$$pred[3][3] = 3*23 + 2*11 + 3*22 >> 3$$
$$= 157 >> 3$$
$$= 10011101 >> 3$$
$$= 10011$$
$$= 19$$

The bottom grid of data in FIG. 9 is delta [i] [j] and this is simply the difference between elem [i] [j] and pred [i] [j]. The values of delta [i] [j] are smaller than those of elem [i] [j], which is helpful for efficient Golomb-Rice encoding.

A second method of delta-encoding is identified by setting the prediction mode bit equal to 1. In this method, a predicted activation data value in an 8×8 tile is predicted based on the value of the same activation data value in the preceding channel. This delta-encoding method cannot be used to compress activation data values in the first channel of activation data in a layer, as there is no preceding channel from which to make a prediction. Accordingly, all tiles of activation data values in the first channel will be compressed using the above-described spatial delta-encoding method described in a case that the prediction mode bit is set to 0.

In the second delta-encoding method, an 8×8 tile of activation data in one of a plurality of channels has values elem [i] [j] [z] where i is the vertical coordinate, j is the horizontal coordinate, and z is the depth coordinate corresponding to different channels. The prediction for each entry in the tile is pred [i] [j] [z] where i is the vertical coordinate, j is the horizontal coordinate, and z is the depth coordinate. A difference value, delta [i] [j] [z], is the difference between elem [i] [j] [z] and pred [i] [j] [z].

pred[i][j][z]=elem[i][j][z−1]

Figure 10:
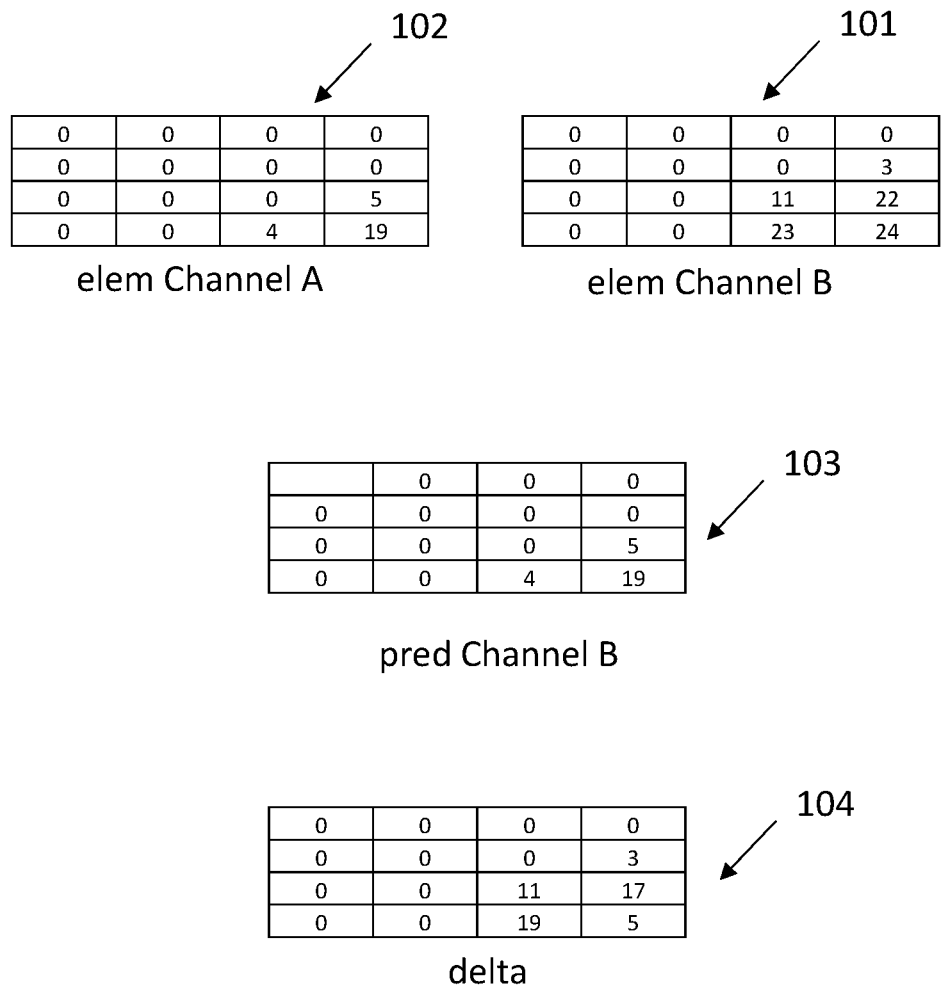
FIG. 10 illustrates a second worked example of delta encoding activation data.

A worked example is now provided, with reference to FIG. 10. As noted above, the delta encoding is performed on 8×8 tiles of activation data. However, to keep the description concise an explanation of delta encoding on a 4×4 grid of data will be given. The top-right grid of data 101 shown in FIG. 10 is the original data for delta encoding, in a channel B. This data forms elem [i] [j] [z] as described above. The top-left grid of data 102 is the tile of data having the same position in the preceding channel, channel A.

In the middle grid of data 103, the predicted values for channel B, pred [i] [j] [z], are shown. The predicted values correspond to the activation data values having the same location in the tile 102 of the preceding channel.

The predictions for all non-zero values in elem channel B are:

pred[2][2][2]=elem[2][2][1]=0 pred[3][2][2]=elem[3][2][1]=4 pred[1][3][2]=elem[1][3][1]=0 pred[2][3][2]=elem[2][3][1]=5 pred[3][3][2]=elem[3][3][1]=19

The bottom grid of data 104 in FIG. 10 is delta [i] [j] [z] and this is simply the difference between elem [i] [j] [z] and pred [i] [j] [z]. The values of delta [i] [j] [z] are then Golomb-Rice encoded. They are smaller than those of elem [i] [j] [z] which is helpful for efficient Golomb-Rice encoding. The resulting Golomb-Rice codes are then stored to the DRAM.

The re-ordering of the filters of the neural network 10 allows the delta-encoding to use the preceding channel activation values when predicting activation data values. This results in a more accurate prediction, which in turn results in a smaller delta value and so a smaller Golomb-Rice code—the compression of activation data is thus more efficient. Therefore, the re-ordering of the filters to increase correlation between output channels of activation data improves the compression of activation data.

After storing the compressed activation data in the DRAM 16, later in the processing of the neural network 10, the NPU 33 needs to retrieve the activation data for further calculations. Accordingly, the compressed activation data is read from the DRAM 16 and decompressed. The compressed activation data is read from the DRAM 16 in the same order that it was stored. Accordingly, a first channel of activation data that is stored in the DRAM 16 is read from the DRAM first.

The original activation data can be recovered from the compressed activation data as follows. The Golomb-Rice codes are decoded back into values to retrieve the delta-encoded activation data values. In a case where the first method of delta-encoding was used, the top-left value, elem [0] [0] is known because it was stored without delta-encoding. Based on this value elem [1] [0] can be determined in the left-hand column by determining the pred [1] [0] is equal to the top-left corner value and using the formula:

elem[*i*][*j*]=delta[*i*][*j*]+pred[*i*][*j*]

Once elem [1] [0] is determined it is then possible to calculate elem [2] [0] and so on down the left-hand edge. Similarly, elem [0] [1] on the top edge can be determined based on top-left hand tile activation value and the value delta [0] [1] in the compressed activation data. Accordingly, the top row of values of elem [i] [j] can be recovered. The remaining values of elem[i] [j] can be determined working away from the top-left corner in diagonals.

An order for recovering the values elem [i] [j] is shown in FIG. 11. Calculating values along the left-hand edge is done first and is shown in FIG. 11 by the numeral 1. The values along the top edge is done second can also be calculated by starting with elem [0] [1] and working along the edge. This is shown in FIG. 11 with the numeral '2'. Once elem [i] [j] values are known for the top edge and the left edge of the tile, it becomes possible to determine elem[i] [j] for values in diagonals away from the top-left hand corner because the values of elem [i] [j] necessary to determine pred [i] [j] become known. These calculations are shown in order by numerals '3' to '15' in FIG. 11. In this way the activation data is recovered for tiles that use the first method of delta encoding.

Decoding tiles that were encoded using the second method of delta-encoding is possible because for tiles that have been delta-encoded using this method the preceding channel of activation data will have been read from the DRAM 16 and decoded. Accordingly, the prediction value can be identified from the preceding channel of activation data and the activation data value recovered using the formula elem[*i*][*j*]=delta[*i*][*j*]+pred[*i*][*j*]

Second Specific Embodiment—2-Bit Compression

In a second embodiment, further methods of compression may be introduced to select between in step S24*b*. In the second embodiment, the prediction mode has a 2-bit value and four delta-encoding methods may be selected between for each tile of activation data.

As in the first embodiment, the neural processing unit 33 will attempt to compress the activation data using each of the four delta-encoding methods that will be described below. The tile of data will be compressed using the method that generates the smallest size of compressed activation data and the compressed activation data will be stored in the DRAM 16.

The first method is indicated by prediction mode bits set to value 00. In this method, no prediction is made of the value of an activation data value—the prediction is disabled. The activation data values are not delta encoded or converted to Golomb-Rice codes. The activation data is stored in the DRAM. This method is provided in case the other delta-encoding methods fail for some reason.

The second method is indicated by prediction mode bits having a value 01. In this method, the value of activation data value in an 8×8 tile of data is predicted based a weighted combination of the activation data value located one position to the left, the activation data value located on position diagonally to the upper-left, and the activation data value located above the predicted value, as discussed previously in connection with first embodiment.

pred[*i*][*j*]=3*elem[*i*][*j*−1]+2*elem[*i*−1][*j*−1]+3*elem[*i*−1][*j*]>>3

In this method, as explained above, activation data values in the left-most column will be predicted based on the value of the activation data value one position above, and activation data values in the top row will be predicted based on the value of the activation data value one position left. The top-left activation data value in the tile will not be predicted and will instead be stored in a raw format.

pred[*i*][*j*][*z*]=elem[*i*−1][*j*][*z*]

Where j=0 and i≠0 pred[*i*][*j*][*z*]=elem[*i*][*j*−1][*z*]

Where j≠0 and i=0

As this method was described in detail in connection with the first embodiment, the description will not be repeated here.

The third method is identified by prediction mode bits being set to a value 10. In this method, the predicted activation data value in an 8×8 tile of activation data is predicted based on the activation data value that has the same position in the previous channel, as discussed above with reference to FIG. 10. As in the first embodiment, this delta-encoding method cannot be used to compress activation data values in the first channel of activation data, as there is no preceding channel of activation data on which to base the prediction.

pred[*i*][*j*][*z*]=elem[*i*][*j*][*z*−1]

Where z≠0

The fourth delta-encoding method is identified by the prediction mode bits having a value 11. This method combines the three-term spatial prediction method with the depth prediction method. The value of a given activation data value in an 8×8 tile of data is predicted based on a combination of the values of activation data values in the same tile and channel, and the same activation data value in the previous channel.

The top-left activation data value in the tile is not delta-encoded. Activation data values on the left side of the tile are predicted using the activation data value located one position above and a corresponding activation data value in the preceding channel. This applies to all left edge activation data values except the top-left activation data value.

$$\text{pred}[i][j][z] = \text{elem}[i-1][j][z] + \text{elem}[i][j][z-1] >> 1$$

Where j=0, i≠0, z≠0

Values of pred [i] [j] [z] on the top row are predicted using the activation data value located one position to the left and a corresponding activation data value in the preceding channel. This applies to all top activation data values except the top-left activation data value.

$$\text{pred}[i][j][z] = \text{elem}[i][j-1][z] + \text{elem}[i][j][z-1] >> 1$$

Where j≠0, i=0, z≠0

For the remaining values of pred [i] [j] [z], except the top-left activation data value, the following scheme is used. The prediction is made using a weighted combination of the activation data value located one position to the left, the activation data value located on position diagonally to the upper-left, the activation data value located above the predicted value, and the activation data value in the same position in the previous channel. This method cannot be used on activation data in the first channel generated by processing the neural network, as there is no preceding channel on which to base the prediction.

$$\text{pred}[i][j][z] = 3*\text{elem}[i][j-1][z] + 2*\text{elem}[i-1][j-1][z] + 3*\text{elem}[i-1][j][z] + 8*\text{elem}[i][j][z-1] >> 4$$

Where z ≠ 0

The above formula indicates that the left-side and upper activation data values are multiplied by three, the upper-left activation data value is multiplied by two, and the activation data value in the preceding channel is multiplied by eight in the linear combination. The last feature (>>4) indicates that the calculation is done in binary and represents a bit shift of 4 places. This has the effect of dividing by 16, while maintaining an integer value for pred [i] [j] [z].

Decoding the fourth delta-encoding method uses the same order for decoding as described in connection with the first method in the first specific embodiment described with reference to FIG. 11. The only difference is that when determining the prediction, pred [i] [j] [z], the formulae given above are used, which refer to corresponding activation data values in the preceding channel.

With the exception of the first method in which no prediction is made, the difference value, delta [i] [j] [z], is Golomb-Rice encoded for each activation data values in the tile of activation data and the Golomb-Rice codes are then stored to the DRAM.

Third Specific Embodiment—3-Bit Compression

In a third embodiment, further delta-encoding methods are selectable by the NPU 16. In this embodiment, the prediction mode is encoded in 3 bits at the start of each tile of activation data, and the delta-encoding method used in the tile of activation data is indicated by the value of these prediction mode bits.

As in the first and second embodiments, the neural processing unit 33 attempts to compress the activation data using each method and selects the best method. The tile of compressed activation data stored in the DRAM using the method selected for that tile of data and indicated in the prediction mode bits.

The first method is identified by prediction mode bits having value 000. In this method, no prediction is made of the value of the activation data value—the prediction is disabled. This method stores raw activation data values in the DRAM and is provided in a case that the other delta-encoding methods fail for some reason.

The second method is identified by the prediction mode bits being set to value 001. In this method, the value of a given activation data value in an 8×8 tile of data is predicted based on the activation data value located one position above. This method cannot be used for activation data values in the top row of the 8×8 tile, which are stored in raw format without delta encoding for that tile of activation data.

$$\text{pred}[i][j][z] = \text{elem}[i-1][j][z]$$

Where i≠0

This method differs from methods described in the first and second specific embodiments because all the activation data values, except those on the top row, are predicted based on the activation data value one position above in the same channel.

A third method is identified by prediction mode bits being set to value 010. In this method, the value of a given activation data value in an 8×8 tile of data is predicted based on the activation data value located one position to the left in the same channel of activation data. This method cannot be used for activation data values in the left-most column of an 8×8 tile, which are not delta encoded.

$$\text{pred}[i][j][z] = \text{elem}[i][j-1][z]$$

Where j≠0

The fourth method is identified by prediction mode bits being set to a value 011. In this method, the predicted value of an activation data value in an 8×8 tile of activation data is predicted based on a weighted combination of the activation data value located one position to the left, the activation data value located on position diagonally to the upper-left, and the activation data value located above the predicted value, as discussed previously in the first and second specific embodiments.

$$\text{pred}[i][j] = 3*\text{elem}[i][j-1] + 2*\text{elem}[i-1][j-1] + 3*\text{elem}[i-1][j] >> 3$$

In this method, as previous explained, activation data values in the left-most column will be predicted based on the value of the activation data value one position above, and activation data values in the top row will be predicted based on the value of the activation data value one position left. The top-left activation data value in the tile will not be predicted and will instead be stored in a raw format.

$$\text{pred}[i][j][z] = \text{elem}[i-1][j][z]$$

Where j=0 and i≠0

$$\text{pred}[i][j][z] = \text{elem}[i][j-1][z]$$

Where j and i=0

The fifth method is identified by the prediction mode bits being set to a value 100. In this method, the value of a given activation data value in an 8×8 tile of data is predicted based on the value of the activation data value in the same position in the preceding channel, as discussed previously in connection with the first embodiment. As before, this method cannot be used on the first channel of activation data generated when processing the neural network, as there is no preceding channel of activation data. Accordingly, another method is used for the first channel of activation data.

$$\text{pred}[i][j][z] = \text{elem}[i][j][z-1]$$

Where z≠0

A sixth method is identified by the prediction mode bits being set to a value 101. In this method, a predicted activation data value in an 8×8 tile of data is based on a combination of the values of activation data values one position above the activation data value to be predicted in the same channel of activation data and the activation data in the same position in the preceding channel. This method cannot be used for activation data in the top row of an 8×8 tile, nor for the first channel of activation data generated by the NPU 33 processing the neural network 10.

pred=elem[i][j][z]=elem[i−1][j][z]+elem[i][j][z−1]>>1

Where i≠0 and z≠0

The seventh method is identified by the prediction mode bits being set to a value 110. In this method, the predicted activation data value in an 8×8 tile of data is based on a combination of the activation data values one position left of the activation data value to be predicted and the activation data value in the same position in the preceding channel. This method cannot be used for activation data values in the left-most column of an 8×8 tile, nor for the first channel of activation data generated by the NPU 33 processing the neural network 10.

pred[i][j][z]=elem[i][j−1][z]+elem[i][j][z−1]>>1

Where j≠0 and z≠0

Decoding delta-encoded values generated by the sixth and seventh methods uses the same calculation as for decoding the other delta encoding methods.

elem[i][j]=delta[i][j]+pred[i][j]

The prediction, pred [i] [j] is determined from the formulae given above which reference to activation data values that will have been previously decoded by the NPU 33.

The eighth method is identified by the prediction mode bits being set to a value 111. This method combines the three-term spatial prediction method with the depth prediction method. The value of a given activation data value in an 8×8 tile of data is predicted based on a combination of the values of activation data values in the same tile and channel, and the same activation data value in the previous channel, as described previously in the fourth method of the second specific embodiment. This method cannot be used for the first channel of activation data generated by the NPU 33 processing the neural network.

$$pred[i][j][z] = 3*elem[i][j-1][z] + 2*elem[i-1][j-1][z] + 3*elem[i-1][j][z] + 8*elem[i][j][z-1] >> 4$$

Where $z \neq 0$ $$pred[i][j][z] = elem[i-1][j][z] + elem[i-1][j][z-1] >> 1$$

Where $j = 0$, $i \neq 0$, $z \neq 0$ $$pred[i][j][z] = elem[i][j-1][z] + elem[i][j][z-1] >> 1$$

Where $j \neq 0$, $i = 0$, $z \neq 0$

In all of the methods described above except the first method in which the activation data was not compressed, the difference value delta [i] [j] [z] is calculated for each activation data value and Golomb-Rice encoded, the Golomb-Rice codes are then stored to the DRAM.

Fourth Specific Embodiment—Alternative Delta-Encoding Mode

A further method for delta-encoding will now be described. This method could be used as a standalone method for compressing the activation data or could be substituted for one of the other delta-encoding methods described above in connection with the first to third specific embodiments.

Figure 12:
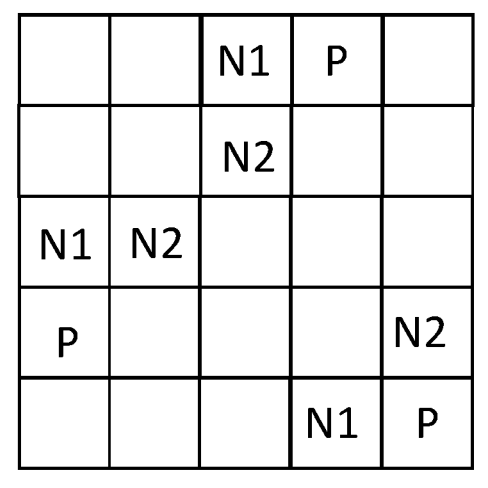

FIG. 12 shows neighboring values N1 and N2 for an activation data value P to be delta encoded. Three different configurations of neighboring pixels are shown in FIG. 12. The configuration shown at the top of FIG. 12 in which a pixel P is predicted based on the pixel to the left of P and the pixel to the bottom left of P is suitable for a delta encoding of activation data values on the top row of the tile of activation data. The configuration shown in FIG. 12 to the left-hand side in which P is predicted based on a pixel above the pixel and a pixel to the top-right of P is suitable for a delta encoding of activation data values on the left-hand column of the tile of activation data. The configuration shown in the bottom right of FIG. 12 is a configuration for use for other pixels that are not on the left-hand edge or the top edge. The pixel is delta-encoded based on the values of a pixel to the left and a pixel above the target pixel.

The neighboring pixels, N1 and N2 have may have values, such that one has a higher value and the other a lower value. For simplicity of explanation, we will assume that N1 is lower than N2. However, if the reverse is true, the explanation below is trivially adapted. A first bit is used to encode whether the value of P falls within the range [N1, N2]. The value P may fall outside the range [N1, N2] in which case it may either fall above the range or below the range. Accordingly, a second bit encodes whether the value of P is above or below the range [N1, N2]. If the value P falls within the range [N1, N2], which is expected to be a common occurrence, then the delta encoding is determined to be P−N1. If the value P falls below the value N1, the delta encoding is determined to be N1−P−1. Finally, if the value P falls above the value N2, the delta encoding is determined to be P−N2−1.

A statement of this algorithm for delta encoding, after outputting two activation values in the tile without delta encoding, is as follows:
1. Select the next activation data value and its two nearest neighbors N1 and N2
2. Compute L=min (N1, N2), H=max (N1, N2)
3. If L≤P≤H, use one bit to encode IN RANGE then the delta encoding is P−L
4. If P<L, use one bit to encode OUT OF RANGE and one bit to encode BELOW RANGE and delta encoding is L−P−1
5. If P>H, use one bit to encode OUT OF RANGE and one bit to encode ABOVE RANGE and delta encoding is P−H−1

The neighboring activation data values shown in FIG. 12 are in the same channel of activation data as the activation data value to be predicted. However, the method above can be varied so that one of the neighbors is the activation data value having a corresponding location in the preceding channel of activation data. In this case, the other neighbor could be the pixel to the left, the pixel above or another neighboring pixel in the same channel of activation data.

The activation data values are converted to Golomb-Rice codes as described in the first embodiment and other details of the first to third specific embodiments are the same.

Further Specific Embodiments—Compressing Other Parameters

In the embodiments above, the activation data values have been delta encoded based on corresponding activation data values in the preceding channels and compressed using Golomb-Rice codes. However, further use may be made of the correlation between neighboring channels of activation data.

In the header of each tile of activation data, along with the prediction mode bits, there is stored a Golomb-Rice code parameter which represents the divisor used to generate the Golomb-Rice codes for that tile of activation data. In this way a different Golomb-Rice code parameter may be used for different tiles of data, which may allow the length of the Golomb-Rice codes to be further optimized reducing the volume of compressed activation data to be stored in the DRAM. To further save on bits to be stored, the Golomb-Rice code parameter in the tile header may itself be stored as a unary value that is a difference compared to the Golomb-Rice code parameter used in the header of the corresponding tile of activation data in the preceding channel. This allows a saving in the number of bits in the header of each tile of activation data.

In a further specific embodiment, rather than compressing activation data using delta encoding and Golomb-Rice codes, the method may be applied to weight values associated with each channel of activation data. The weight values need to written to and read from a memory, such as the DRAM for use in the convolution calculations by the NPU. As discussed above, there is correlation between weight values in the filters used to generate each channel of activation data (i.e. the filters are not orthogonal) such that delta-encoding the weight values by reference to the corresponding weight values in a neighboring filter after the filters have been re-ordered may be beneficial.

It has been found that compression of weight values in this way tends to be less effective than the compression on activation data values described in the first embodiment. This is because after pruning and quantization, the weight values tend to be noisier reducing the correlation between weight values at the same location in neighboring filters. Nevertheless, some compression improvement may be found by applying delta-encoding that is based on weight values in adjacent filters. The filter reordering process for this specific embodiment is the same as described in connection with the first embodiment and is not repeated here.

Further Specific Embodiment—CPU

The first embodiment is an example of activation data being compressed and decompressed in an NPU. In a further embodiment, a companion compressor/decompressor for a CPU may be provided that employs a similar method for compressing and decompressing activation data. As in the first embodiment, the neural network has been adapted by a channel re-ordering process of the type previously described. The CPU may have SimD capability to calculate convolutions. Many convolutions would be performed if the CPU is used to perform calculations for a convolutional neural network. Activation data from the convolutions may be output to a line buffer, which stores a stripe (spatial subset of a tensor) of activation data from the CPU. The CPU is configured to output a stripe of data for each channel of a neural network. The companion compressor/decompressor provided on the CPU chipset receives and processes the multiple channels of a stripe of activation data and compresses the data into NHWC format. NHWC format is used to store the activation data and has many corresponding elements in different channels. When performing compression, the companion compressor/decompressor may use a delta-encoding method that makes use of correlation between activation data values in neighboring channels of stripe data. For each activation data value, elem 1, in the stripe of activation data except the first, a prediction from a preceding data value in the stripe and the corresponding element in the preceding channel of strip data may be made:

$$\mathrm{pred}[i][z] = \mathrm{elem}[i-1][z] + \mathrm{elem}[i][z-1] \gg 1$$

$i \neq 0$  $z \neq 0$

The stripe of data is then delta encoded based on the prediction:

$$\mathrm{delta}[i][z] = \mathrm{elem}[i][z] - \mathrm{pred}[i][z]$$

The activation data values of the first channel of stripe data are not delta encoded or may only be delta encoded spatially within the strip of data. Further, the first activation value (elem [0] [z]) in the other stripes is also not delta encoded as it is used as a reference value. The activation data values, after delta encoding, are converted to Golomb-Rice codes and stored by the companion compressor/decompressor in a memory.

In this embodiment, the compression occurs as a separate background operation, after the CPU has output a single stripe of activations. As the activations of the neural network are output one channel at a time, in this embodiment the compression would begin after all channels of activation data have been output for a single stripe.

The companion compressor/decompressor also has the function of reading the compressed activation data values from the memory. The decompression is simply the reverse of the compression steps. The first channel or preceding channel of stripe data and first element within a stripe are available to allow pred[i] [z] to be identified and the original data value can be determined as $$\mathrm{elem}[i][z] = \mathrm{pred}[i][z] + \mathrm{elem}[i][z]$$

Further Specific Embodiment—Input Image for Filter Reordering

In the first embodiment the order of channels was determined by inputting a training image and reordering the channels based on the activation data generated based on the training image. As discussed in the first embodiment, this could be done for multiple training images and a most common channel order selected. In a further embodiment, the channel reordering may be performed based on a parametrized input image, such as pink or brown noise with a similar frequency characteristic to the expected activations. In this way, by using a parameterized image an optimum order for the filters in the neural network may be identified more accurately based on a single input image without the need to solve the travelling salesman problem for multiple input images.

Further Specific Embodiment—Bit Cost Estimator as Difference Measure

In the first embodiment the difference between channels of activation data for channel reordering was determined by finding the L1 norm of the difference between the channels. The L1 norm could be replaced by the L2 norm in another embodiment. In a further embodiment, the difference measurement calculation could take into account adjacent values within the first channel of the pair of channels, $z_0$, when calculating a difference to a second channel, $z_1$. For instance, the difference may be calculated by using the prediction of a data element value as described in previous embodiments.

$$\text{Difference}(z_0, z_1) = \sum_{x,y} |A(x, y, z_0) - pred(x, y, z_0, z_1)|$$

In this embodiment, the prediction value pred (x, y, $z_0$, $z_1$) may be found by any of the prediction methods disclosed previously that refers to a preceding channel. The same prediction method could be used across the channel. However, it is also possible to vary the prediction method for each tile in the channel when calculating the difference. For each tile, the best of the possible prediction modes that refer to an adjacent channel would be used, with this selected prediction mode being kept consistent across each tile of data.

In a further embodiment, a non-linear function may be used as the difference function.

Further Specific Embodiment—Non-Linear Difference Calculation

Golomb-Rice codes increase in bit length dependent on the value of the Golomb-Rice parameter M. However, if the difference between channels is lower than the value of parameter M, the bit length of the code will not be reduced—the Golomb-Rice code bit length will remain the same until the difference exceeds parameter M. To take into account that the Golomb-Rice code bit length does not increase in size in a linear fashion, a non-linear function, could be considered for the difference measurement calculation. For example, a non-linear step function could be used.

What is claimed is:

1. A method performed by a processing element for adapting a trained neural network, the method comprising:
inputting input data to the trained neural network and applying a plurality of filters of the neural network to the input data to generate a plurality of channels of activation data;
calculating differences between corresponding activation values in the plurality of channels of activation data;
calculating cumulative differences between pairs of channels based on the calculated differences, so that the channels of the network form the nodes of a fully connected graph in which nodes of the graph correspond to channels of activation data and graph edges correspond to the cumulative differences between pairs of channels;
determining an order of the plurality of channels based on the calculated cumulative differences; and
adapting the neural network so that it will generate channels of activation data in the order determined in the determining step to generate an adapted neural network.

2. A method according to claim 1 further comprising, a second processing element performing a method of compressing activation data from the adapted neural network, the method further comprising:
inputting input data to the adapted neural network;
applying a set of filters of the adapted neural network to the input data to generate an ordered sequence of channels of activation data;
calculating a difference between a value associated with a channel of activation data and a prediction for the value based on a corresponding value in a neighboring channel in the ordered sequence of channels; and
compressing the difference between the value and the prediction for the value.

3. A method according to claim 2, wherein the value is a parameter for creating a variable length code and the prediction for the value is the corresponding value of the parameter for creating a variable length code in the neighboring channel.

4. A method according to claim 3, wherein the parameter for creating a variable length code is a Golomb-Rice code parameter.

5. A method according to claim 2, wherein the value associated with the channel of activation data is an activation data value within the channel of activation data.

6. A method according to claim 5, wherein the prediction of the activation data value is based on a corresponding activation data value in the neighbouring channel.

7. A method according to claim 5, wherein the prediction value is based on a corresponding activation data value in the neighbouring channel and a value of one or more other activation values in the same channel of activation data.

8. A method according to claim 7, wherein the prediction of the activation data value is based on a linear combination of activation data values within the same channel having locations one position to the left of the activation data value, one position above the activation data value, one position diagonally to the upper-left of the activation data value, and an activation data value in an adjacent channel having the same position.

9. A method according to claim 7, wherein the prediction of the activation data value is a linear combination of activation data values having locations one position above the activation data value in the same channel, and the same position in an adjacent channel.

10. A method according to claim 7, wherein the prediction of the activation data value is a linear combination of activation data values having locations one position to the left of the activation data value, and an activation data value having the same position in an adjacent channel.

11. A method according to claim 5, wherein the difference between the activation data value and the prediction of the value is compressed using a variable length code.

12. A method according to claim 11, wherein the variable length code is a Golomb-Rice code.

13. A method according to claim 2 further comprising the step of the processing element writing the compressed value to a storage.

14. A method according to claim 1, wherein the input data is one of real data or a parametrized data having a representative set of frequency characteristics.

15. A method according to claim 1, wherein determining an order of the plurality of channels comprises finding an exact or approximate solution to a travelling salesman problem across the fully connected graph.

16. A data processing system comprising a processing element and a storage, the storage storing code portions that, when executed by the processing element, cause the data processing system to perform a method for adapting a trained neural network, the method comprising:

inputting input data to the neural network;
applying a set of filters of the neural network to the input data to generate a plurality of channels of activation data
calculating differences between corresponding activation values in the plurality of channels of activation data;
calculating cumulative differences between pairs of channels based on the calculated differences, so that the channels of the network form the nodes of a fully connected graph in which nodes of the graph correspond to channels of activation data and graph edges correspond to the cumulative differences between pairs of channels;
determining an order of the plurality of channels based on the calculated cumulative differences; and
adapting the neural network so that it will generate channels of activation data in the order determined in the determining step to generate an adapted neural network.

* * * * *